United States Patent [19]

Rother et al.

[11] Patent Number: 4,718,113

[45] Date of Patent: Jan. 5, 1988

[54] ZERO-IF RECEIVER WIH FEEDBACK LOOP FOR SUPPRESSING INTERFERING SIGNALS

[75] Inventors: Dietrich Rother, Tamm; Dieter Wiechert, Neuenburg-Arnbach; Manfred Moster, Niefern, all of Fed. Rep. of Germany

[73] Assignee: Alcatel NV, Amsterdam, Netherlands

[21] Appl. No.: 854,278

[22] Filed: Apr. 21, 1986

[30] Foreign Application Priority Data

May 8, 1985 [DE] Fed. Rep. of Germany ....... 3516492

[51] Int. Cl.$^4$ .............................................. H04B 1/16
[52] U.S. Cl. ..................................... 455/209; 455/302;
455/306; 455/314; 455/324; 329/124
[58] Field of Search .............. 455/207, 208, 209, 303,
455/304, 306, 314, 315, 324, 302; 375/77;
329/50, 124; 307/520

[56] References Cited

U.S. PATENT DOCUMENTS

| | | | |
|---|---|---|---|
| 3,961,262 | 6/1976 | Gassman | 455/208 |
| 4,476,585 | 10/1984 | Reed | 455/209 |
| 4,599,743 | 7/1986 | Reed | 455/209 |

FOREIGN PATENT DOCUMENTS 1530602 11/1978 United Kingdom .

*Primary Examiner*—Robert L. Griffin
*Assistant Examiner*—Elissa Seidenglanz
*Attorney, Agent, or Firm*—Christie, Parker & Hale

[57] ABSTRACT

A working on the zero IF principle is disclosed which contains a feedback circuit instead of a preselector for suppressing interfering signals. The interfering signals contained in the incoming signal ($F_E$) are separated from the useful signal by filters in the baseband. They are then reconverted to the RF value, amplified, and substracted from the incoming signal ($F_E$) by a subtracter (S1). In the steady state, the output of the subtracter (S1) provides the useful signal, which is converted into the baseband and then fed to a signal processor (SV).

7 Claims, 2 Drawing Figures

ZERO-IF RECEIVER WITH FEEDBACK LOOP FOR SUPPRESSING INTERFERING SIGNALS

FIELD OF THE INVENTION

The present invention relates to a radio receiver and more particularly to an "exact zero IF" receiver.

BACKGROUND ART

Published German Patent Application DE-OS No. 26 45 950.7 (which corresponds to published U.K. Patent Specification No. 1,530,602) discloses an "exact zero IF" receiver for frequency modulated signals. Interference suppression and receiver selectivity depend essentially only on the quality of the low-pass filters.

DISCLOSURE OF THE INVENTION

The object of the invention is to provide a receiver working on the zero IF principle which provides improved interference suppression and selectivity as compared with the prior art.

This object is attained by the means of a noise or interference suppression loop. In accordance with a preferred embodiment, mixers up-convert the IF to RF so that noise may be subtracted in a feedback loop.

The novel receiver needs no preselector tunable to different incoming frequencies. It is suitable for several methods of modulation, such as FM, PM and AM. It will now be described with reference to the accompanying drawings, in which:

BEST MODE FOR PRACTICING THE INVENTION

Figure 1:
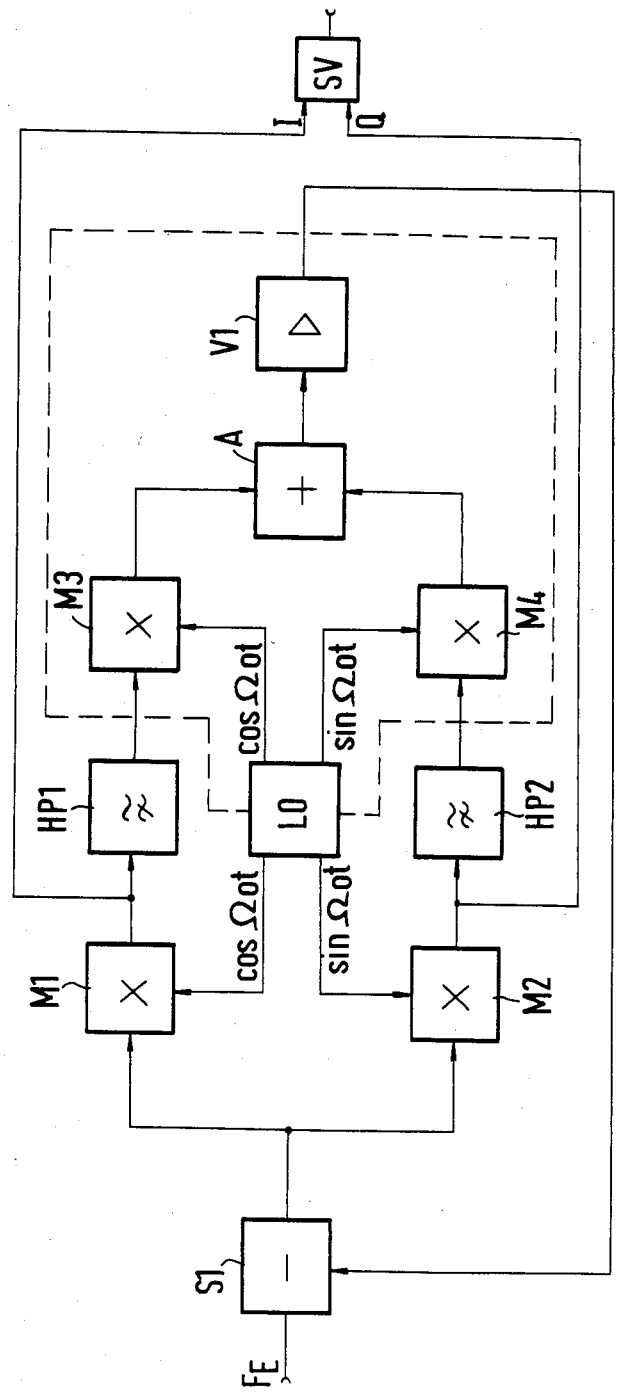
FIG. 1 is a block diagram of a first embodiment of the receiver.

Referring first to FIG. 1, the first embodiment of the receiver contains a subtracter S1, four mixers M1 to M4, an oscillator LO, an adder A, an amplifier V1, and a signal processor SV. One input of each of the mixers is connected to the oscillator LO. The other inputs of the mixers M1 and M2 are connected to the output of the subtracter S1. Each of the mixers is followed by a high-pass filter HP1, HP2. The output of the high-pass filter HP1 is fed to the input of the mixer M3, and that of the high-pass filter HP2 to the input of the mixer M4. The output of each of the mixers M3 and M4 is connected to one of the inputs of the adder A. The output of the adder A passes through the amplifier V1 and is applied to one of the inputs of the subtracter S1.

The other input of the subtracter S1 is presented with the incoming signal $F_E$.

The oscillator LO is tuned to the center frequency of the incoming signal $F_E$. The signal applied to the mixers M1 and M3 from the oscillator LO is in quadrature with the oscillator signal applied to the mixers M2 and M4. The signal applied to the mixers M1 and M2 is converted to the zero IF by being mixed with the oscillator signals. Only the quadrature components of the interfering signals contained in the incoming signal $F_E$ are passed by the high-pass filters HP1 and HP2 and are up-converted to the original RF value in the mixers M3 and M4 by being mixed with the oscillator signals. The outputs of the mixers M3 and M4 are added in the adder A. The resulting signal corresponds to the interfering signals in the incoming signal $F_E$.

It is amplified by the amplifier V1 and then subtracted from the incoming signal $F_E$ by the subtracter S1. The receiver thus contains a feedback circuit which, in the steady state, eliminates the interfering signals from the incoming signal $F_E$.

The output of the subtracter S1 thus provides a useful signal whose quadrature components are obtained from the outputs of the mixers M1 and M2 and fed to a signal processor SV.

Figure 2:
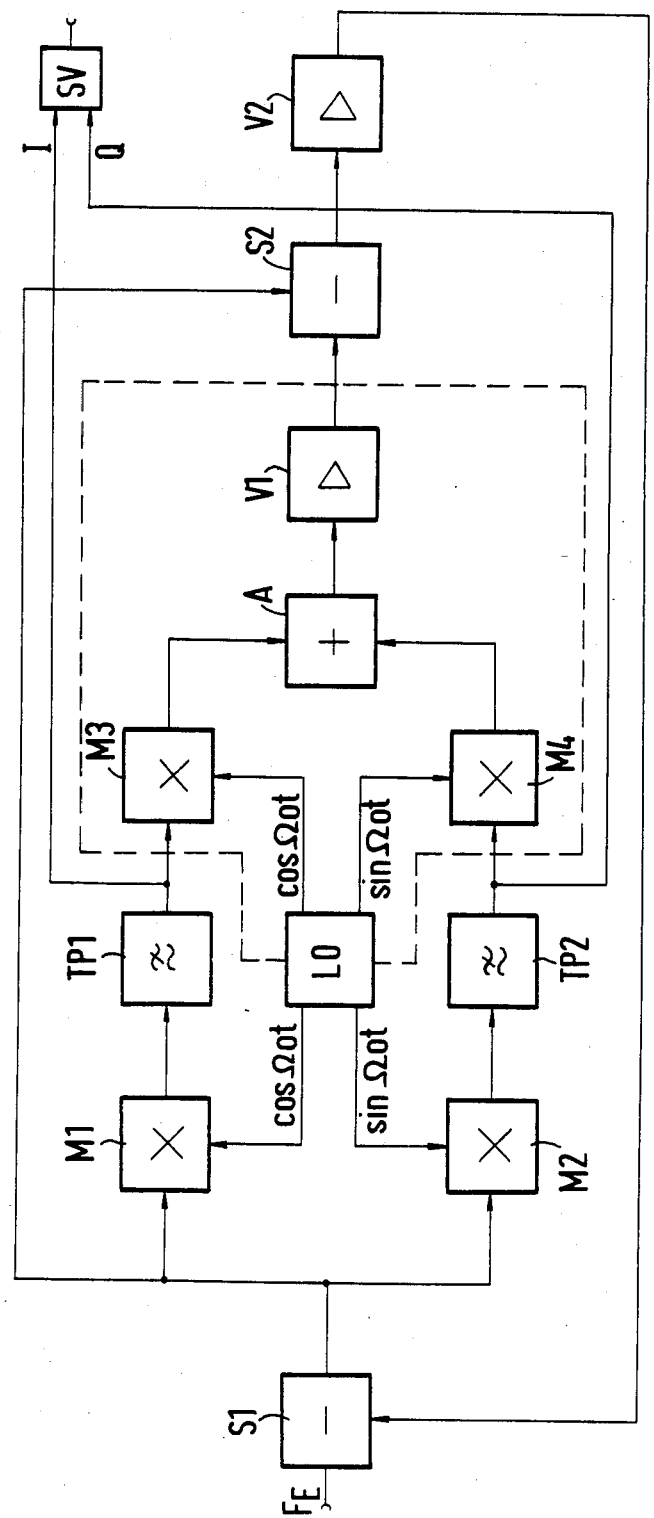
FIG. 2 is a block diagram of a second embodiment of the receiver.

The second embodiment of the receiver, shown in FIG. 2, differs from the receiver of FIG. 1 in that an additional subtracter S2 and an additional amplifier V2 are connected in series between the output of the amplifier V1 and said one input of the subtracter S1. In addition, the output of the subtracter S1 is connected to an input of the subtracter S2. Instead of the high-pass filters HP1, HP2, Low-pass filters TP1, TP2 are present.

Only the quadrature components of the useful signal contained in the incoming signal $F_E$ are passed by the low-pass filters TP1 and TP2, up-converted to the original RF value by the mixers M3 and M4, added by the adder A, amplified, and fed to the additional subtracter S2, which subtracts the useful signal from the signal applied to the mixers M1 and M2. The output of the additional subtracter S2 thus provides only the interfering signals contained in the incoming signal. These interfering signals are amplified by the additional amplifier V2, then subtracted from the incoming signal $F_E$ by the subtracter S1. The quadrature components of the useful signal are obtained from the outputs of the low-pass filters TP1, TP2 and fed to a signal processor SV.

In both embodiments, the selectivity of the receiver can be further improved by inserting additional circuits with different frequency responses, such as high-pass filters, low-pass filters, and all-pass networks, in the feedback circuit.

The signal processor SV can be implemented in analog or digital technology. It contains at least a demodulator. Depending on the modulation method used, it may contain further circuits, such as converters, amplifiers, etc.

One or both of the high-pass filters HP1 and HP2 is/are realized with a low-pass filter having its output coupled through an amplifier to one of the inputs of a subtracter. The signal to be filtered is also applied directly to the other input of the subtracter.

The combination of a subtracter or adder and a following amplifier is implemented with a transformer having two primary coils and one secondary coil in which the necessary voltage gain is achieved by a suitable choice of the number of turns.

In a transceiver, the portion enclosed by the broken line in both figures can be used as a converter during transmission. In this case, a transmit-receive switch is provided both at the inputs of the mixers M3 and M4 and at the output of the amplifier V1 following the adder A. During transmission, therefore, the inputs of the mixers M3 and M4 are connected to the outputs of a quadrature modulator, and the output of the amplifier V1 is connected to the input of a transmitter power stage. The quadrature modulator generates from a modulating signal two signals in phase quadrature which are fed to the mixers M3, M4. It can be implemented in analog or digital technology.

We claim:

1. A radio receiver for receiving an incoming input signal having an associated carrier frequency, said receiver comprising an oscillator for producing first and second oscillator signals differing in phase by 90° and having the same frequency as the carrier of the input signal;

a subtractor having subtractor first and second inputs and a subtractor output, said incoming signal being coupled to said first subtractor input;

first and second primary mixers each having primary mixer first and second inputs and a primary mixer output, the primary mixer first inputs being coupled to the subtractor output and the respective first and second primary mixer second inputs being coupled to the respective first and second oscillator signals;

first and second high-pass filters each having a high-pass filter input and high-pass filter output, the respective first and second high-pass filter inputs being coupled to the respective first and second primary mixer outputs;

first and second secondary mixers each having secondary mixer first and second inputs and a secondary mixer output, the respective first and second secondary mixer first inputs being coupled to the respective first and second oscillator signals and the respective first and second secondary mixer second inputs being coupled to the respective first and second high-pass filter outputs;

an adder having adder first and second inputs respectively coupled to the respective first and second secondary mixer outputs, said adder also having an adder output coupled to said subtractor second input, said subtractor subtracting the error signal output by said adder from the incoming signal to form the input signal to said primary mixers; and a signal processor for further signal processing of the signals output by the first and second primary mixers.

2. The receiver of claim 1 further comprising an amplifier having an amplifier input connected to said adder output, said amplifier also having an amplifier output, connected to said subtractor second input.

3. A receiver as claimed in claim 1, characterized in that the signal processor (SV) contains a demodulator and is implemented in digital and/or analog technology.

4. A receiver as claimed in claim 1, characterized in that at least part of the adders and/or subtracters are realized with transformers or low-noise amplifiers.

5. A radio receiver for receiving an incoming input signal having an associated carrier frequency, said receiver comprising an oscillator for producing first and second oscillator signals differing in phase 90° and having the same frequency as the carrier of the input signal;

a primary subtractor having primary subtractor first and second inputs and a subtractor output, said incoming signal being coupled to said primary subtractor first input;

first and second primary mixers each having primary mixer first and second inputs and a primary mixer output, the primary mixer first inputs being coupled to each other and to the primary subtractor output and the respective first and second primary mixer second inputs being coupled to the respective first and second oscillator signals;

first and second low-pass filters each having a low-pass filter input and a low-pass filter output, the respective first and second low-pass filter inputs being coupled to the respective first and second primary mixer outputs;

first and second secondary mixers each having secondary mixer first and second inputs and a secondary mixer output, the respective first and second secondary mixer first inputs being coupled to the respective first and second oscillator signals and the respective first and second secondary mixer second inputs being coupled to the respective first and second low-pass filter outputs for mixing the low-pass-filtered signal with the oscillator signals differing in phase by 90°;

an adder having adder first and second inputs respectively coupled to the respective first and second secondary mixer outputs, said adder also having an adder output;

an amplifier having an amplifier input coupled to said adder output, said amplifier also having an amplifier output;

a secondary subtractor having a second subtractor first input coupled to said amplifier output and a secondary subtractor second input coupled to said primary subtractor output, said secondary subtractor also having a secondary subtractor output for outputting an error signal, said primary subtractor subtracting the error signal output by said secondary subtractor from the incoming signal to form the input signal to said primary mixers, the outputs of the low-pass filters being fed to a signal processor for further signal processing off.

6. A receiver as claimed in claim 5 characterized in that it is employed in a radio transceiver, with the low-pass filters, the additional mixers, the adder and the amplifier (V1) being used as a converter stage during transmission.

7. The receiver of claim 5 further comprising a first amplifier having a first amplifier input connected to said adder output, said first amplifier also having a first amplifier output connected to said second subtractor second input; and a second amplifier having an second amplifier input connected to said second subtractor output, said second amplifier also having a second amplifier output connected to said first subtractor second input.

* * * * *